United States Patent [19]

Thomas et al.

[11] Patent Number: 5,418,681
[45] Date of Patent: May 23, 1995

[54] CAPACITIVE MICRO-SENSOR WITH A LATERAL PROTECTION AND MANUFACTURING METHOD

[75] Inventors: Isabelle Thomas; Pierre O. Lefort; Christophe Legoux, all of Valence, France

[73] Assignee: Sextant Avionique, Meudon la Foret Cedex, France

[21] Appl. No.: 20,086

[22] Filed: Feb. 19, 1993

[30] Foreign Application Priority Data

Feb. 20, 1992 [FR] France .................. 92 02192

[51] Int. Cl.⁶ .................................. H01G 7/00
[52] U.S. Cl. .................. 361/283.4; 29/25.41
[58] Field of Search .......... 361/280, 283.1, 283.3, 361/283.4; 73/715, 718, 724; 29/25.41, 621.1, 25.42; 257/419; 338/4, 42; 128/675, 748

[56] References Cited

U.S. PATENT DOCUMENTS

| | | | |
|---|---|---|---|
| 4,875,134 | 10/1989 | Kuisma | 29/25.42 |
| 4,879,627 | 11/1989 | Grantham | 73/718 |
| 4,951,174 | 8/1990 | Grantham | 361/283 |
| 5,095,752 | 3/1992 | Suzuki et al. | 73/517 R |

FOREIGN PATENT DOCUMENTS 59-186345 10/1984 Japan.

Primary Examiner—Bruce A. Reynolds
Assistant Examiner—Michael D. Switzer
Attorney, Agent, or Firm—Lowe, Price, LeBlanc & Becker

[57] ABSTRACT

A capacitive micro-sensor includes a sandwich of at least two silicon plates. A peripheral stripe of each side of one plate is assembled to a corresponding stripe of the opposing surface of an adjacent plate through an insulating layer. The lateral sides of the sandwich are provided with notches partially penetrating in each of the insulating layers, and are thicker than the thickness of the insulating layers.

8 Claims, 2 Drawing Sheets

CAPACITIVE MICRO-SENSOR WITH A LATERAL PROTECTION AND MANUFACTURING METHOD

BACKGROUND OF THE INVENTION

1. Field of the Invention

The present invention relates to silicon capacitive micro-sensors. Such micro-sensors are, for example, pressure sensors, acceleration sensors, and so forth.

2. Discussion of the Related Art

Over the last years, new silicon micro-sensors have been developed, taking advantage of the silicon etching techniques developed for the manufacturing of semiconductor electronic components. Initially, such micro-sensors were formed by the combination of suitably etched silicon plates and thin glass plates serving as airtight chamber or as separating insulating plates inserted between the silicon plates, these glass plates bearing various metal electrode patterns.

Nowadays, the trend is to develop micro-sensors entirely made of silicon, without any glass plate having an active function. Schematic examples of such sensors are shown in FIGS. 1 and 2.

FIG. 1 shows an acceleration sensor; FIG. 2 shows a pressure sensor. Each of these sensors includes a central silicon plate 1 sandwiched between the external silicon plates 2 and 3. Insulation between the plates is ensured by a first insulating stripe, usually a silicon oxide layer, 5, between plates 1 and 2, and a second insulating stripe, 6, between plates 1 and 3. Such frame insulating stripes are disposed between adjacent plates, along the edges of the latter. Oxide layers are grown or deposited on one of the adjacent plates. Once the three plates are assembled, welding is carried out by annealing at a temperature within the range of 900° to 1100° C. To achieve this purpose, experiment shows that the silicon and silicon oxide surfaces facing each other must have a very slight roughness, for example lower than 0.5 nm. The external silicon plates 2 and 3 define between themselves and with the frame portion of the silicon plate 1 a region in which a controlled atmosphere is contained, such as an atmosphere below atmospheric pressure, referred to as a vacuum.

The above description commonly applies to the micro-sensors of FIGS. 1 and 2.

In the example of FIG. 1, which is a schematic cross-sectional view of an accelerometer, the central silicon plate 1 is etched before being assembled in order to include a frame and a central plate or inertia block 8 fixed to the frame by thin suspension rods 9. A single rod is shown in the schematic cross-sectional drawing of FIG. 1. Conventionally, two-rod or four-rod suspension systems are used. The external plates 1 and 3 delineate a vacuum cavity with the frame formed at the periphery of the central plate. The capacitance variations between the upper surface of the inertia block and the silicon plate 3 are detected and also, if required, between the lower surface of the inertia block and the lower plate 2. When the device is subject to acceleration, inertia block 8 moves with respect to the whole device, causing the above-mentioned capacities to vary. Additionally, an electrostatic control is generally provided in order to maintain the inertia block in place by applying a d.c. electric field; it is then the error signal which indicates the capacity variation.

FIG. 2 schematically shows a structure forming a pressure sensor. The lower plate 2 is etched in order to form a thin diaphragm 11. Plate 1 is etched to form a stud 12 contacting the diaphragm. A silicon strip 13 extends between stud 12 and the frame of plate 1. Again, the area delineated by the upper plate, the lower plate and the frame of the central plate defines a vacuum cavity. Variations of the external pressure deform diaphragm 11 and create stresses in strip 13. This stress variation causes variation of the resonance frequency of the capacitive resonator formed by strip 13 (vibrating beam) and the opposing surface of plate 3. Preferably, the internal side of plate 3 is etched in order to form a protruding stripe facing strip 13.

In the example of FIG. 1, electrodes 21, 22 and 23 must be coupled to plates 1, 2 and 3, respectively. In the example of FIG. 2, only electrodes 21 and 23 are required.

The drawback of these prior art structures, directly measuring either a capacity or a resonance frequency, is that measurements are substantially impaired by the presence of high stray capacities. Such stray capacities mainly correspond to the capacities between the frame formed in plate 1 and the opposed portions of the upper and/or lower plate, the dielectric of these capacities being formed by the silicon oxide insulating layers 5 and 6. The value of these stray capacities is not only high but also variable. This variation may more particularly result from deposition of polluting material or dampness on the lateral surfaces of the device at the sides of the insulating layers 5 and 6. Additionally, in practice, the manufacturing of a micro-sensor as the one shown in FIG. 1 or 2 results from a collective process, each plate being initially part of a silicon wafer, the separation into individual sensors being made after the end assembling operations and, if required, after the contact operations. Generally this separation is made by sawing off and, during the sawing step, silicon particles can be moved to the above-mentioned surface areas, which increases the value of the stray capacities and may even short two silicon plates.

SUMMARY OF THE INVENTION

An object of the invention is to provide a micro-sensor structure avoiding the occurrence of such total or partial shorts liable to affect the capacities associated with the lateral sides of the micro-sensors.

Another object of the invention is to provide a micro-sensor structure avoiding stray capacity variation as a function of the micro-sensor's environment.

To achieve these objects, the invention provides a capacitive micro-sensor including a sandwich of three silicon plates. A peripheral stripe of each side of the central plate is assembled to a corresponding stripe of the opposing surface of an external plate through an insulating stripe. The lateral sides of the sandwich are notched at the peripheral region of each insulating layer.

According to an embodiment of the invention, the notches are filled with a protection material.

According to an embodiment of the invention, the lateral sides of the device are entirely coated with a protection material.

The invention also provides a method for manufacturing a capacitive micro-sensor comprising the steps of assembling three silicon plates separated one from the other, at least at their periphery, by an insulating stripe. Each plate is initially part of a silicon wafer. Individual devices are formed by sawing off the plate assembly, in which, before assembling, a groove is formed in at least one of the surfaces of each of the two opposing plates in the sawing region, the groove being broader than the sawing region. Each groove can include two groove portions on both sides of the sawing region.

An embodiment of the invention comprises the steps of partially sawing off the assembly of the three plates, until the first two plates are sawn off while leaving in place at least a portion of the thickness of the third plate; filling the groove thus formed with a protection product; then, carrying out a new sawing operation in order to entirely divide the plate assembly into individual devices. The second sawing off step is carried out with a narrower saw than the saw that served for the first sawing operation.

The foregoing and other objects, features, aspects and advantages of the invention will become apparent from the following detailed description of the present invention when taken in conjunction with the accompanying drawings.

Figure 1:
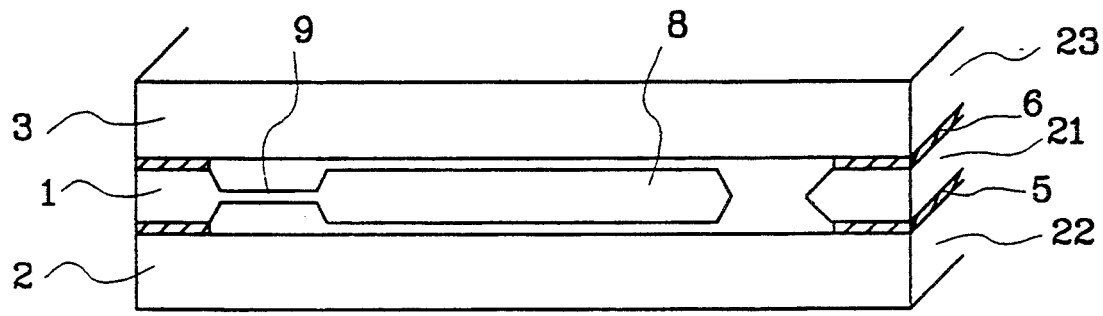
FIGS. 1 and 2, above described, are schematic cross-sectional views of an acceleration micro-sensor and a pressure micro-sensor of the prior art.
Figure 2:
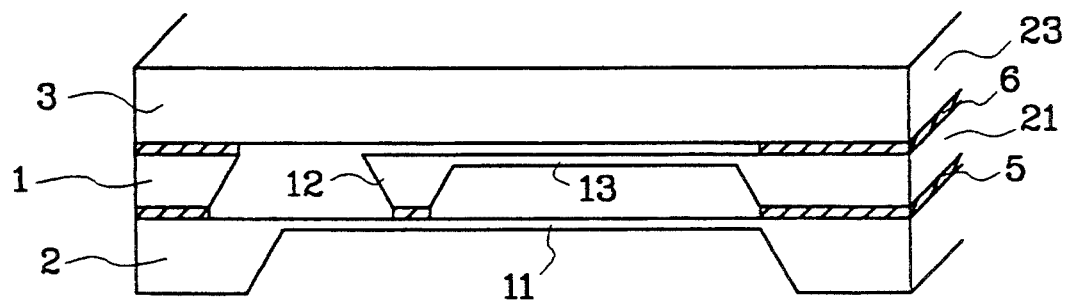

In the drawings, the relative thicknesses of the various layers and the lateral sizes of the various elements are not to scale but are arbitrarily drawn in order to facilitate the legibility of the drawings.

DETAILED DESCRIPTION

Figure 3:
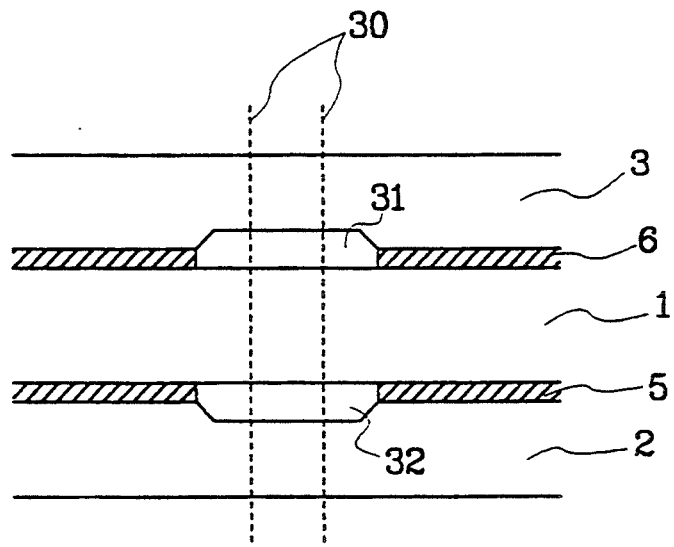
FIG. 3 is a cross-sectional view of a portion of the separation region between two micro-sensors before the sawing step.

FIG. 3 is a schematic cross-sectional view of a portion of an assembly of three silicon wafers 1, 2 and 3 in a region where a separating cut is to be made between two elemental devices. The sawing off region is marked with two dotted lines 30, the space between the lines symbolizing the width of a cut of saw (for example, 0.2–0.3 mm). To give an order of magnitude, it will be reminded that each silicon wafer 1, 2, 3 conventionally has a thickness of approximately 0.3–0.4 mm and the insulating oxide layers 5 and 6 between the plates have a thickness of approximately 1 $\mu$m.

The invention provides to form in the wafers, before they are assembled, grooves 31 and 32 where cuts with a saw are to be made. Each groove is broader than the saw cut (for example approximately 0.4–0.5 mm) and is deeper than the thickness of the oxide layer (for example, approximately 10 to 50 $\mu$m). Thus, the cut with the saw no longer contacts the apparent edge of the oxide layers 5 and 6, and, thereby, no longer risks to "stick" silicon particles therein.

In the given example, groove 31 is formed in the silicon wafer 3 and groove 32 is formed in the silicon wafer 2. It will be noted that one and/or another groove can also be formed in the central plate 1.

In the exemplary embodiment of FIG. 3, grooves 31 and 32 are uninterruptedly formed. In fact, it is sufficient that grooves partially extend on both sides of the region where the cut with the saw is given so that, after the sawing step, there remains in the lateral sides some notches in which the insulating layers 5 and 6 end.

The structure schematically shown in FIG. 3 allows to avoid depositions of silicon particles on the oxide layer edges. However, such structure does not avoid the capacity variation phenomena associated, for example, with damp lateral walls of the devices.

Figure 4A:
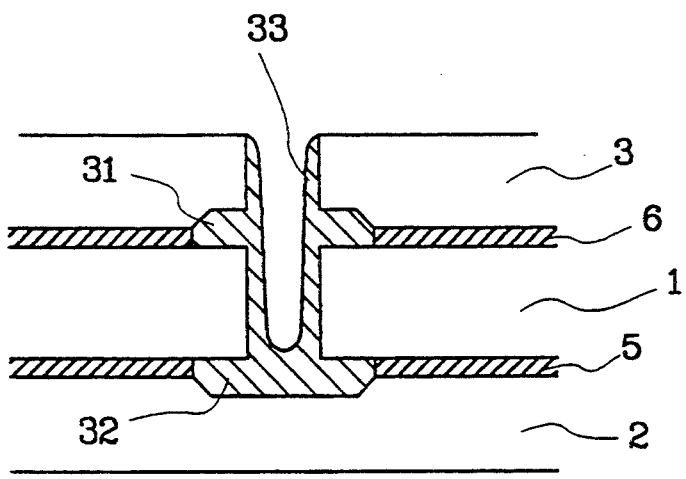
FIG. 4A is a cross-sectional view of a portion of the separation region between two micro-sensors during an intermediate sawing step.

In order to also solve this problem, the invention provides to give a partial cut with the saw, such as illustrated in FIG. 4A, by traversing, for example, the silicon wafers 3 and 1 down to groove 32. Once this first sawing step is achieved, the groove thus formed is filled with a mineral or organic protection material 33 which protects the apparent edges of the oxide layers 5 and 6. A second full cut with the saw is then achieved throughout the device assembly, by sawing off again the protection material 33.

Figure 4B:
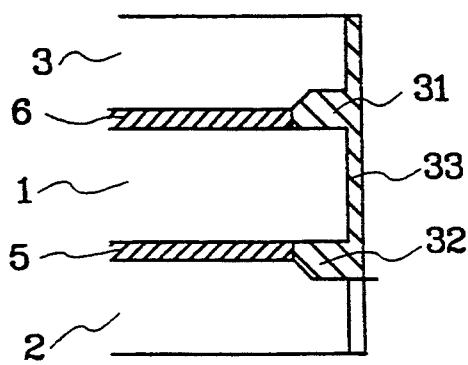
FIG. 4B is a cross-sectional view of the edge of a micro-sensor after a sawing step according to the invention.

Preferably, the first cut with the saw is given with a relatively broad saw (for example 0.3 mm), and the second sawing step is carried out with a narrower saw (for example 0.2 mm), so that there remains in place on the lateral sides of each device a protection material having a predetermined thickness in addition to the protection material that penetrated into the grooves provided in the lateral interfaces between the plates. A structure such as the structure shown in FIG. 4B is then obtained, which solves the above-mentioned problems.

Although the invention has been described in relation with a specific micro-sensor structure including a sandwich of three silicon plates laterally separated by an oxide plate, the invention also applies to other types of micro-sensor in which the insulating layer is not an oxide layer but, for example, a sandwich of an insulating layer, a conductive layer and an insulating layer.

The invention also applies when the sandwich comprises only two silicon plates or more than three plates.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

We claim:

1. A capacitive micro-sensor including a sandwich of at least two silicon plates (1,2,3), a peripheral stripe of each side of one plate being assembled to a corresponding stripe of the opposing surface of an adjacent plate through an insulating layer (5,6), wherein the lateral sides of said sandwich are provided with notches partially penetrating in each of said insulating layers and thicker than the thickness of the insulating layers.

2. The capacitive micro-sensor of claim 1, wherein said notches are filled with a protection material (33).

3. The capacitive micro-sensor of claim 2, wherein said lateral sides of the device are coated with a protection material (33).

4. The capacitive micro-sensor of claim 1 comprising three silicon plates.

5. The capacitive micro-sensor of claim 1, formed by a method of manufacture compromising the steps of assembling at least two silicon plates separated one from the other, at least at their periphery, by an insulating layer, each plate being initially part of a silicon wafer, individual devices being formed by sawing off said plate assembly, wherein, before assembling, a groove (31,32) is formed in at least one of the surfaces of each of the two opposing plates in the sawing region, said groove being broader than the sawing off region.

6. The manufacturing method of claim 5 wherein the micro-sensor includes three silicon plates, comprising the following steps:

partially sawing off said three plate assembly, until the first two plates are sawn off while leaving in place at least a portion of the thickness of the third plate;

filling the groove thus formed with a protection product (33); and carrying out a new sawing operation in order to entirely divide the plate assembly into individual devices.

7. The manufacturing method of claim 6, wherein the second sawing off operation is carried out with a narrower saw than the saw that served for the first sawing operation.

8. The manufacturing method of claim 7, wherein said groove includes two groove portions on both sides of said sawing region.

* * * * *